(12) United States Patent
Potocek et al.

(10) Patent No.: US 11,380,529 B2
(45) Date of Patent: Jul. 5, 2022

(54) DEPTH RECONSTRUCTION FOR 3D IMAGES OF SAMPLES IN A CHARGED PARTICLE SYSTEM

(71) Applicant: FEI Company, Hillsboro, OR (US)

(72) Inventors: Pavel Potocek, Eindhoven (NL); Miloš Hovorka, Brno (CZ); Maurice Peemen, Eindhoven (NL); Lukáš Hübner, Brno (CZ)

(73) Assignee: FEI Company, Hillsboro, OR (US)

( * ) Notice: Subject to any disclaimer, the term of this patent is extended or adjusted under 35 U.S.C. 154(b) by 91 days.

(21) Appl. No.: 17/039,513

(22) Filed: Sep. 30, 2020

(65) Prior Publication Data

US 2022/0102121 A1   Mar. 31, 2022

(51) Int. Cl.
*H01J 37/32* (2006.01)
*H01J 37/28* (2006.01)

(52) U.S. Cl.
CPC ........ *H01J 37/32926* (2013.01); *H01J 37/28* (2013.01); *H01J 2237/2004* (2013.01); *H01J 2237/226* (2013.01)

(58) Field of Classification Search
CPC .......... H01J 37/00; H01J 37/02; H01J 37/023; H01J 37/22; H01J 37/24; H01J 37/244; H01J 37/26; H01J 37/261; H01J 37/28; H01J 37/32926; H01J 2237/2004; H01J 2237/226
USPC ......................................... 250/306, 307, 311
See application file for complete search history.

(56) References Cited

U.S. PATENT DOCUMENTS

| | | | | |
|---|---|---|---|---|
| 2011/0266440 | A1* | 11/2011 | Boughorbel | H01J 37/222 378/43 |
| 2014/0007307 | A1* | 1/2014 | Routh, Jr. | H01J 37/3056 850/3 |
| 2016/0189922 | A1* | 6/2016 | Kooijman | H01J 37/244 250/307 |

OTHER PUBLICATIONS

Q. He, M. Hsueh, G. Zhang, D.C. Joy, & R.D. Leapman, Biological serial block face scanning electron microscopy at improved z-resolution based on Monte Carlo model, Scientific Reports, Aug. 28, 2018, Nature.com.

* cited by examiner

*Primary Examiner* — Jason L McCormack

(57) ABSTRACT

Methods and systems for generating high resolution reconstructions of 3D samples imaged using slice and view processes where the electron interaction depth of the imaging beam is greater than slice thicknesses. Data obtained via such slice and view processes is enhanced with a depth blur reducing algorithm, that is configured to reduce depth blur caused by portions of the first data and second data that are resultant from electron interactions outside the first layer and second layer, respectively, to create enhanced first data and second enhanced data. A high-resolution 3D reconstruction of the sample is then generated using the enhanced first data and the enhanced second data. In some embodiments, the depth blur reducing algorithm may be selected from a set of such algorithms that have been individually configured for certain microscope conditions, sample conditions, or a combination thereof.

20 Claims, 5 Drawing Sheets

DEPTH RECONSTRUCTION FOR 3D IMAGES OF SAMPLES IN A CHARGED PARTICLE SYSTEM

BACKGROUND OF THE INVENTION

Slice and view charged particle imaging is an essential tool for sample reconstruction and examination in biological research, semiconductor debugging, material science, as well as numerous other applications. In slice and view charged particle imaging, consecutive surface layers of a sample are iteratively imaged and then removed, and then the resultant images are combined to form a 3D reconstruction of the sample. For example, FIG. 1 illustrates a sample process 100 for conducting slice and view imaging on with a charged particle microscope. Specifically, FIG. 1 includes three images that depict iterative steps of the slice and view imaging process.

Image 102 shows SEM imaging of an $n^{th}$ layer of a sample 108. During the SEM imaging an electron beam 110 is scanned across the surface 108 of the $n^{th}$ layer of the sample 108, and a detector 112 detects emissions 114 resultant from the sample being irradiated by the electron beam. Image 104 then depicts the process of the $n^{th}$ layer of the sample 108 being removed and/or otherwise delayered. While Image 104 depicts the $n^{th}$ layer being removed with a focused ion beam 116, the $n^{th}$ layer may be removed using other mechanisms, such as an electron beam, a laser, a diamond blade, etc. As shown in image 106, the SEM imaging can then be repeated on the $n^{th}+1$ layer of the sample 108. The detected emissions 114 from images 102 and 106 are then used to generate an image of the $n^{th}$ layer of the sample 108 and the $n^{th}+1$ layer of the sample 108, respectively. As slice and view charged particle imaging acquires a series of cross-sectional images of a sample at various depths along the z-axis, the acquired images and/or the data they are generated from can be used to reconstruct a 3D representation of the sample.

However, a fundamental limitation of slice and view charged particle imaging is the increase in blurring of the 3D reconstruction along the z-axis of the sample (i.e., z-blur) that occurs as the thickness of the slice of sample removed is reduced below the electron interaction depth of the charged particle beam. The electron interaction depth corresponds to the perpendicular distance from the surface of the sample 108 to the further part of a region of the sample that the electrons/charged particles of the imaging beam interact with to cause the molecules/elements/features within the region of the sample to release emissions 114. For example, images 102 and 106 illustrate the electron interaction area 118 (i.e., the region of the sample that electrons introduced by the electron beam 110 interact with) as extending below the thickness of the $n^{th}$ and $n^{th}+1$ sample layer, respectively. As the detected emissions 114 contain information describing the electron interaction area 118 which they are resultant from, the images generated from such detected emissions include information from z-depths that are greater than the slice thickness. That is, even though the image is intended to depict the corresponding slice of the sample, when the electron interaction depth exceeds the thickness of the slice of sample removed then the image contains information from multiple slices. This phenomenon is what causes the aforementioned blurring of the 3D reconstruction along the z-axis.

To combat this, current practice is to reduce the voltage of the charged particle beam such that there is a smaller electron interaction area 120. While this reduces the depth of the electron interaction area, the reduced voltage of the charged particle beam causes a corresponding reduction in emissions 114 which in turn reduces the signal to noise ratio (SNR) of the signal obtained by the detector 112. Moreover, the reduction of the voltage of the charged particle beam also makes it harder for the beam to be shaped. This variation in beam shape causes a reduction in the x-y resolution of the 3D reconstruction. Accordingly, there is a need for a solution that allows for thinner slices of the sample to be removed (e.g., 2-5 nm or below) without decreasing the x-y resolution or the SNR.

SUMMARY

Methods and systems for generating high resolution reconstructions of 3D samples imaged using slice and view processes where the electron interaction depth of the imaging beam is greater than slice thicknesses, are disclosed. An example method includes acquiring first data relating to a first layer of a sample that has been acquired by irradiation of the first layer of the sample with a charged particle beam, and then acquiring second data relating to a second layer of a sample that has been acquired by irradiation of the second layer of the sample with the charged particle beam, where between the first irradiation and the second irradiation the first layer of the sample was removed, and where the electron interaction depth of the charged particle beam is larger than each of the thickness of the first layer and the thickness of the second layer. The first data and the second data is then enhanced with a depth blur reducing algorithm (e.g., a 3D neural network based algorithm, a 3D blind neural network based algorithm, a training based 3D blind deconvolution algorithm, etc.), that is configured to reduce depth blur caused by portions of the first data and second data that are resultant from electron interactions outside the first layer and second layer, respectively, to create enhanced first data and second enhanced data. A high-resolution 3D reconstruction of the sample is then generated using the enhanced first data and the enhanced second data. In some embodiments, the depth blur reducing algorithm may be selected from a set of such algorithms that have been individually configured for certain microscope conditions (e.g., imaging beam voltage, imaging beam type, spot size, scan speed, etc.), sample conditions (e.g., type of sample, material(s) of the sample, feature(s) of the sample, etc.), or a combination thereof.

Systems for generating high resolution reconstructions of 3D samples imaged using slice and view processes where the electron interaction depth of the imaging beam is greater than slice thicknesses, comprise a sample holder configured to hold a sample, an electron beam source configured to emit an electron beam toward the sample, an electron beam column configured to direct the electron beam onto the sample, a delayering component configured to remove a layer from the surface of the sample, the layer having a known thickness, and one or more detectors configured to detect emissions resultant from the electron beam irradiating the sample. The systems further include one or more processors and a memory storing instructions that when executed on the one or more processors causes the system to acquire first data relating to a first layer of a sample and second data relating to a second layer of the sample via slice and view imagine, where the electron interaction depth of the imaging is larger than each of the thickness of the first layer and the thickness of the second layer, use a depth blur reducing algorithm to enhance the first data and the second data, and then generate a high-resolution 3D reconstruction of the sample using the enhanced data.

Other example methods for generating high resolution reconstructions of 3D samples imaged using slice and view processes where the electron interaction depth of the imaging beam is greater than slice thicknesses, includes training a depth blur reducing algorithm based at least in part on a first set of training data acquired via slice and view charged particle imaging of a training sample, where an electron interaction depth of an imaging beam is greater than the corresponding slice thickness, and a second set of training data that corresponds to a labeled reconstruction of the training sample. First data and second data relating to a first layer of a sample and a second layer of a sample (respectively) via slice and view imaging where the electron interaction depth of the charged particle beam is larger than each of the thickness of the first layer and the thickness of the second layer. The first data and the second data is then enhanced with a depth blur reducing algorithm, that is configured to reduce depth blur caused by portions of the first data and second data that are resultant from electron interactions outside the first layer and second layer, respectively, to create enhanced first data and second enhanced data. A high-resolution 3D reconstruction of the sample is then generated using the enhanced first data and the enhanced second data.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Figure 1:
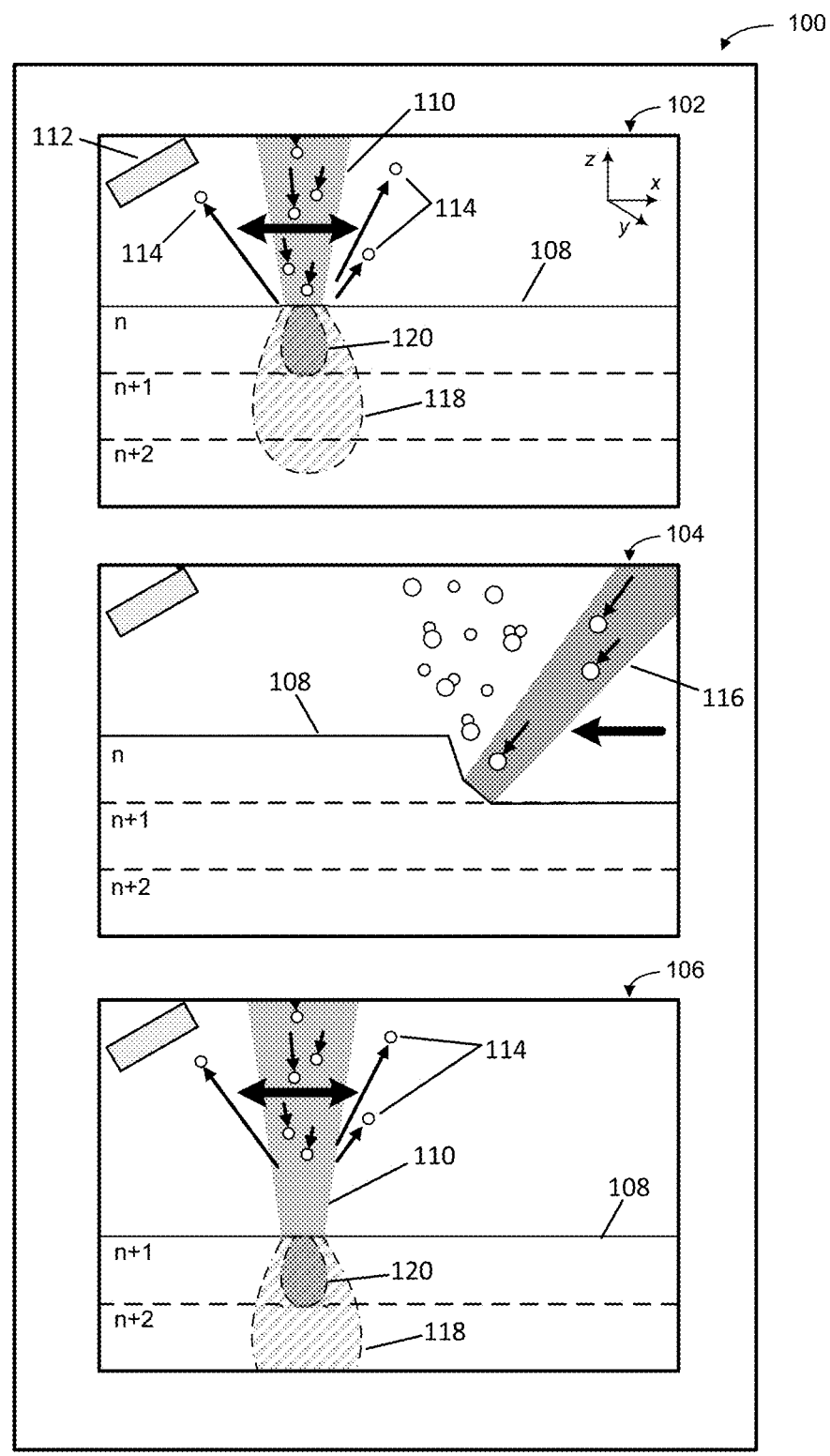
FIG. 1 illustrates a sample process for conducting slice and view imaging on with a charged particle microscope.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Methods and systems for generating high resolution reconstructions of 3D samples imaged using slice and view processes where the electron interaction depth of the imaging beam is greater than slice thicknesses are disclosed herein. Specifically, the methods and systems employ a depth blur reducing algorithm on data acquired via slice and view imaging to allow for the generation of a 3D reconstruction of a sample without the z-direction blurring caused by portions of the data resultant from electron interactions outside of the corresponding sample layer. In some embodiments of the present invention, the depth blur reducing algorithm is trained using a first set of training data acquired via slice and view charged particle imaging of a training sample, where the electron interaction depth of the imaging beam is greater than the corresponding slice thickness, and a second set of training data that corresponds to a labeled reconstruction of the training sample.

The methods and systems of the present disclosure allow for high resolution 3D reconstructions of samples to be obtained with slice and view processes without having to reduce the imaging beam energy so that the electron interaction depth is less than the layer thickness. Additionally, by enabling such slice and view processes to use higher energy beams, the SNR of the acquired data is reduced, and the beam can be consistently shaped to allow for high resolution data acquisition.

Figure 2:
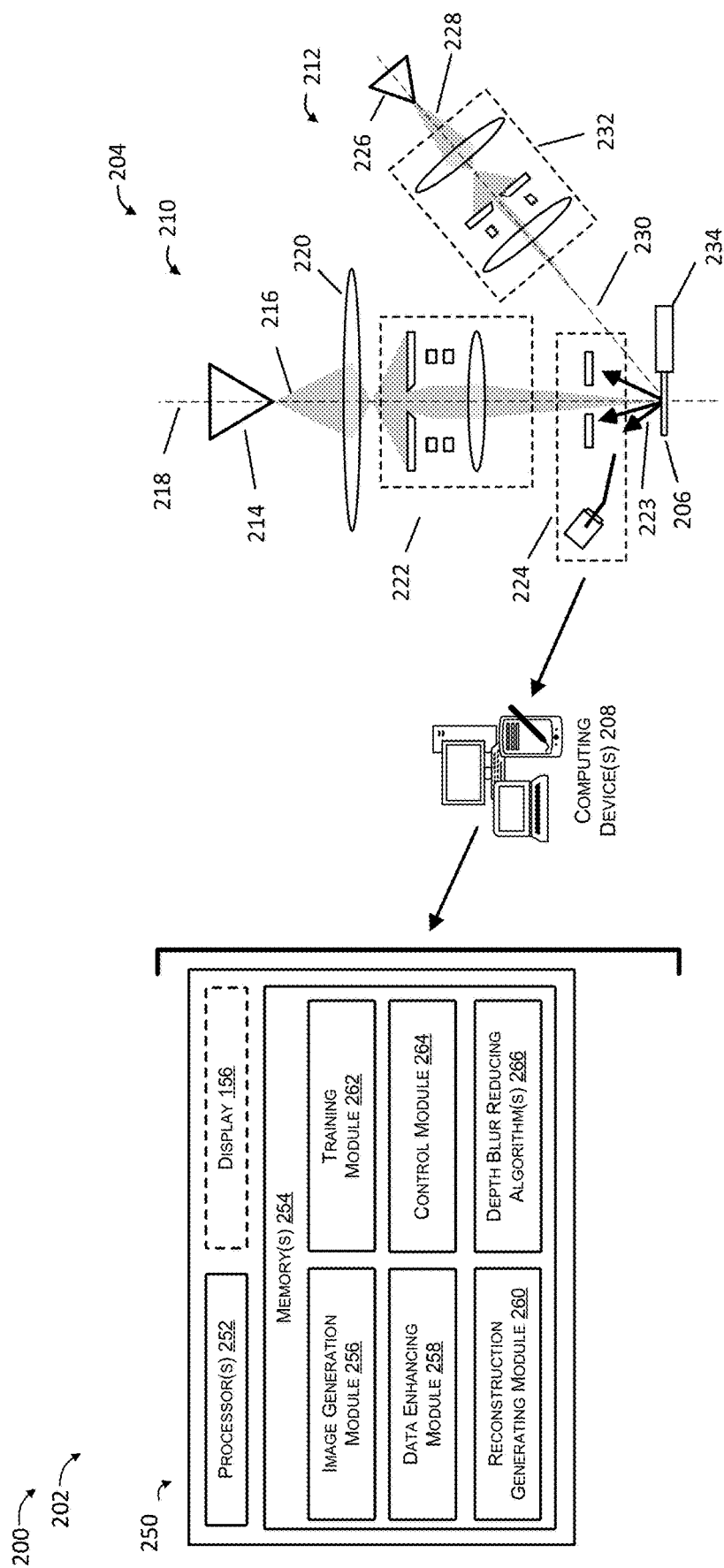
FIG. 2 depicts a sample process for using, training, optimizing, and/or retraining depth blur reducing algorithms for generating high resolution reconstructions of 3D samples imaged using slice and view processes where the electron interaction depth of the imaging beam is greater than slice thicknesses.

FIG. 2 is an illustration of an environment 200 for using, training, optimizing, and/or retraining depth blur reducing algorithms for generating high resolution reconstructions of 3D samples imaged using slice and view processes where the electron interaction depth of the imaging beam is greater than slice thicknesses. Specifically, FIG. 2 shows an example environment 202 that includes an example microscope system(s) 204 for generating slice and view images of a sample 206 and one or more computing devices 208 for using, training, optimizing, and/or retraining depth blur reducing algorithms for generating high resolution reconstructions of 3D samples imaged with reduced z-dimensional blur. It is noted that present disclosure is not limited to environments that include microscopes, and that in some embodiments the environments 200 may include a different type of system that is configured to generate correlated images, or may not include a system for generating images at all.

The example microscope system(s) 204 may be or include one or more different types of optical, and/or charged particle microscopes, such as, but not limited to, a scanning electron microscope (SEM), a scanning transmission electron microscope (STEM), a transmission electron microscope (TEM), a charged particle microscope (CPM), a cryo-compatible microscope, focused ion beam (FIB) microscope, dual beam microscopy system, or combinations thereof. FIG. 2 shows the example microscope system(s) 204 as being a dual beam microscopy system including a SEM column 210 and a FIB column 212.

FIG. 2 depicts the example microscope system(s) 204 as including SEM column 210 for imaging layers of the sample 206 during slice and view imaging. The SEM column 210 includes an electron source 214 (e.g., a thermal electron source, Schottky-emission source, field emission source, etc.) that emits an electron beam 216 along an electron emission axis 218 and towards the sample 206. The electron emission axis 218 is a central axis that runs along the length of the example microscope system(s) 204 from the electron source 214 and through the sample 206. While FIG. 2 depicts the example microscope system(s) 204 as including an electron source 204, in other embodiments the example microscope system(s) 204 may comprise a charged particle source, such as an ion source, configured to emit a plurality of charged particles toward the sample 206.

An accelerator lens 220 accelerates/decelerates, focuses, and/or directs the electron beam 216 towards an electron focusing column 222. The electron focusing column 222 focuses the electron beam 212 so that it is incident on at least a portion of the sample 206. Additionally, the focusing column 222 may correct and/or tune aberrations (e.g., geometric aberrations, chromatic aberrations) of the electron beam 216. In some embodiments, the electron focusing column 222 may include one or more of an aperture, deflectors, transfer lenses, scan coils, condenser lenses, objective lens, etc. that together focus electrons from electron source 214 onto a small spot on the sample 206. Different locations of the sample 206 may be scanned by adjusting the electron beam direction via the deflectors and/or scan coils. In this way, the electron beam 216 acts as an imaging beam that is scanned across a surface layer of the sample (i.e., the surface of the layer proximate the SEM column 204 and/or that is irradiated by the electron beam 216). This irradiation of the surface layer of the sample 206 causes the component electrons of the electron beam 216 to interact with component elements/molecules/features of the sample, such that component elements/molecules/features cause emissions 223 to be emitted by the sample 206. The specific emissions that are released are based on the corresponding elements/molecules/features that caused them to be emitted, such that the emissions can be analyzed to determine information about the corresponding elements/molecules.

While the electron beam 216 is incident on the surface layer of the sample 206 a portion of its component electrons penetrate the sample and interact with elements/molecules/features at different depths from the surface of the sample. An electron interaction depth of the electron beam 216 corresponds to the distance from the surface of the sample that includes 95% elements/molecules/features of the sample that electrons of the electron beam 216 interact with during the irradiation. In this way, the emissions 223 can be analyzed to determine information about elements/molecules that are present from the surface of the sample 206 to the electron interaction depth.

FIG. 2 further illustrates a detector system 224 for detecting emissions resultant from the electron beam 216 being incident on the sample 206. The detector system 224 may comprise one or more detectors positioned or otherwise configured to detect such emissions. In various embodiments, different detectors and/or different portions of single detectors may be configured to detect different types of emissions, or be configured such that different parameters of the emissions detected by the different detectors and/or different portions. The detector system 224 is further configured to generate a data/data signal corresponding to the detected emissions, and transmit the data/data signal to one or more computing devices 208.

While FIG. 2 depicts the example microscope system(s) 204 as including FIB column 212 for removing layers of the sample 206 during slice and view imaging, in other embodiments the example microscope system(s) 204 may include other types of delayering components, such as a laser, a mechanical blade (e.g., a diamond blade), an electron beam, etc. The FIB column 212 is shown as including a charged particle emitter 226 configured to emit a plurality of ions 228 along an ion emission axis 230.

The ion emission axis 230 is a central axis that runs from the charged particle emitter 226 and through the sample 206. The FIB column 212 further includes an ion focusing column 232 that comprises one or more of an aperture, deflectors, transfer lenses, scan coils, condenser lenses, objective lens, etc. that together focus ions from charged particle emitter 226 onto a small spot on the sample 206. In this way, the elements in the ion focusing column 232 may cause the ions emitted by the charged particle emitter 226 to mill away or otherwise remove one or more portions of the sample. For example, during slice and view imaging the FIB column 212 may be configured to cause a surface layer of the sample 206 having a known thickness to be removed from the sample 206 between image acquisitions.

FIG. 2 further illustrates the example microscope system(s) 204 as further including a sample holder 234. The sample holder 234 is configured to hold the sample 206, and can translate, rotate, and/or tilt the sample 102 in relation to the example microscope system(s) 204.

The environment 200 is also shown as including one or more computing device(s) 208. Those skilled in the art will appreciate that the computing devices 208 depicted in FIG. 2 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc. The computing devices 208 may also be connected to other devices that are not illustrated, or instead may operate as a stand-alone system.

It is also noted that one or more of the computing device(s) 208 may be a component of the example microscope system(s) 204, may be a separate device from the example microscope system(s) 204 which is in communication with the example microscope system(s) 204 via a network communication interface, or a combination thereof. For example, an example microscope system(s) 204 may include a first computing device 208 that is a component portion of the example microscope system(s) 204, and which acts as a controller that drives the operation of the example charged particle microscope system(s) 204 (e.g., adjust the scanning location on the sample by operating the scan coils, etc.). In such an embodiment the example microscope system(s) 204 may also include a second computing device 208 that is desktop computer separate from the example microscope system(s) 204, and which is executable to process data received from the detector system 224 to generate images of the sample 206 and/or perform other types of analysis or post processing of detector data. The computing devices 208 may further be configured to receive user selections via a keyboard, mouse, touchpad, touchscreen, etc.

The computing device(s) 208 are configured to generate images of the surface layer of the sample 206 within the example microscope system(s) 204 based on data and/or the data signal from the detector system 224. Specifically, because the data and/or the data signal from the detector system 224 is based on the emissions 223 emitted from the sample 206 during irradiation of the surface of the sample, the data and/or the data signal can be analyzed to determine the makeup of the sample (i.e., component elements/molecules/features) between the surface of the sample and the electron interaction depth of the electron beam 216 such that an image of the surface layer of the sample can be generated. In some embodiments, the images are grayscale images that show contrasts indicative of the shape and/or the materials of the sample.

Moreover, since the FIB column 212 is able to remove a layer of the sample 206 having a known thickness, the computing device(s) 208 are able to determine the location of the sample 206 to which each image of the series of images corresponds. In this way, during the process of slice and view imaging, the computing device(s) 208 generate a series of images of layers of the sample at periodic depths. However, since the images contain information relating to elements/molecules/features between the surface and the electron interaction depth of the electron beam 216, when the thickness of the layer that the FIB column 212 removes is less than the electron interaction depth of the electron beam 216 the images generated by the computing devices 208 depict elements/molecules/features of the sample from multiple layers of the sample. For example, in embodiments where the FIB column 212 removes a 2 nm layer from the surface of the sample 206 and the electron interaction depth of the electron beam 216 is 10 nm, then each image generated by the computing devices 208 would depict elements/molecules/features of the sample from 5 different layers of the sample. Therefore, a 3D reconstruction of the sample 206 that is generated based on such images would have a blurring of the reconstruction due to individual elements/molecules/features being attributed to multiple layers of the sample, when in reality they are only present in one layer.

According to the present invention, the computing device(s) 208 are further configured to apply a depth blur reducing algorithm to one or more of the series of generated images to remove information from individual images that correspond to elements/molecules/features that are present in a layer of the sample 206 to which the individual image does not correspond. In other words, the depth blur reducing algorithm applied by the computing devices 208 reduces image information attributable to data/sensor data corresponding to emissions resultant from electron interactions outside the surface layer (i.e., the layer of the sample between the surface of the sample and the thickness the layer that is removed between imaging during slice and view imaging.) In this way, the depth reducing algorithm generates an enhanced version of the slice and view images that have a reduced amount of information resultant from electron interaction outside the layer of the sample that the corresponding sample depicts.

In some embodiments, the computing device(s) 208 when applying the depth blur reducing algorithm, the computing device(s) 208 may be configured to first access a plurality of depth blur reducing algorithms, and selecting the depth blur reducing algorithm from the plurality of depth blur reducing algorithms based on one or more microscope conditions (e.g., beam voltage, the spot size of the beam, the type of beam, etc.), sample conditions (e.g., a type of sample, a material of the sample, a feature of the sample, etc.), or a combination thereof. Each of the depth blur reducing algorithms of the plurality of depth blur reducing algorithms may be trained for different corresponding microscope conditions, sample conditions, or a combination thereof. In such embodiments, the computing device(s) 208 may select the depth blur reducing algorithm that was trained to the corresponding microscope conditions and/or sample conditions associated with the plurality of generated images.

In various embodiments the depth blur reducing algorithm may comprise a module or collection of modules that determine image information and/or portions of the data/data stream for a plurality of sample layers that is attributable to a same element/molecule/feature, and then determine the layer of the plurality of sample layers in which the element/molecule/feature is actually present. For example, the depth blur reducing algorithm may determine that the element/molecule/feature is located in the centermost layer of the plurality of layers or in the layer for which the image information and/or portions of the data/data stream attributable to the element/molecule/feature is best (i.e., clearest, strongest, highest percentage of the signal for the pixel, etc.).

Alternatively, or in addition, the depth blur reducing algorithm may comprise a machine learning algorithm configured to process data in three or more dimensions, such as a 3D neural network. For example, the depth blur reducing algorithm may comprise a trained 3D neural network that has been trained to receive a plurality of images and/or data generated based on slice and view imaging of a sample where the electron penetration depth of the imaging beam is greater than the slice thickness, and to remove the portions of the plurality of images and/or data that are attributable to elements/molecules/features outside of the corresponding layer of the sample. According to the present invention, such a neural network may be trained using a first set of training data acquired via slice and view charged particle imaging of a sample, where the electron interaction depth of the imaging beam is greater than the corresponding slice thickness, and a second set of training data that corresponds to labeled reconstruction of the sample that is used as a references. In some embodiments, the second set of training data is acquired using a low voltage slice and view process where the electron interaction depth of the imaging beam is less than the corresponding slice thickness. Alternatively, the second set of training data may be acquired at least in part by applying a deconvolution algorithm to at least a portion of the first set of training data. In another embodiment, the second set of training data is a simulated reconstruction of the sample based on a mapping of the sample, a description of the sample, known properties of the sample, or a combination thereof.

FIG. 2 further includes a schematic diagram illustrating an example computing architecture 250 of the computing devices 208. Example computing architecture 250 illustrates additional details of hardware and software components that can be used to implement the techniques described in the present disclosure. Persons having skill in the art would understand that the computing architecture 250 may be implemented in a single computing device 208 or may be implemented across multiple computing devices. For example, individual modules and/or data constructs depicted in computing architecture 250 may be executed by and/or stored on different computing devices 208. In this way, different process steps of the inventive methods disclosed herein may be executed and/or performed by separate computing devices 208 and in various orders within the scope of the present disclosure. In other words, the functionality provided by the illustrated components may in some implementations be combined in fewer components or distributed in additional components. Similarly, in some implementations, the functionality of some of the illustrated components may not be provided and/or other additional functionality may be available.

In the example computing architecture 250, the computing device includes one or more processors 252 and memory 254 communicatively coupled to the one or more processors 252. The example computing architecture 250 can include an image generation module 256, a data enhancing module 258, a reconstruction generating module 260, a training module 262, and a control module 264 stored in the memory 254. The example computing architecture 250 is further illustrated as including depth blur reducing algorithm(s) 266 stored on memory 254. As used herein, the term "module" is intended to represent example divisions of executable instructions for purposes of discussion, and is not intended to represent any type of requirement or required method, manner, or organization. Accordingly, while various "modules" are described, their functionality and/or similar functionality could be arranged differently (e.g., combined into a fewer number of modules, broken into a larger number of modules, etc.). Further, while certain functions and modules are described herein as being implemented by software and/or firmware executable on a processor, in other instances, any or all of modules can be implemented in whole or in part by hardware (e.g., a specialized processing unit, etc.) to execute the described functions. As discussed above in various implementations, the modules described herein in association with the example computing architecture 250 can be executed across multiple computing devices 208.

The image generation module 256 can be executable by the processors 252 to images of the surface layer of the sample 206 within the example microscope system(s) 204 based on data and/or the data signal from the detector system 224. Specifically, because the data and/or the data signal from the detector system 224 is based on the emissions 223 emitted from the sample 206 during irradiation of the surface of the sample, the data and/or the data signal can be analyzed to determine the makeup of the sample (i.e., component elements/molecules/features) between the surface of the sample and the electron interaction depth of the electron beam 216 such that an image of the surface of the sample can be generated. In some embodiments, the images are grayscale images that show contrasts indicative of the shape and/or the materials of the sample.

The data enhancing module 256 can be executable by the processors 252 to apply a depth blur reducing algorithm to one or more of the series of generated images and/or the detector data/data signal to remove information from individual portions thereof that correspond to elements/molecules/features that are present in a layer of the sample 206 to which the individual image does not correspond. In other words, the depth blur reducing algorithm applied by the computing devices 208 reduces information/data attributable to data/sensor data corresponding to emissions resultant from electron interactions outside the surface layer (i.e., the layer of the sample between the surface of the sample and the thickness the layer that is removed between imaging during slice and view imaging.) In this way, the depth reducing algorithm generates an enhanced version of the slice and view images that have a reduced amount of information resultant from electron interaction outside the layer of the sample that the corresponding sample depicts.

The depth blur reducing algorithm(s) 266 may comprise a module or collection of modules that determine image information and/or portions of the data/data stream for a plurality of sample layers that is attributable to a same element/molecule/feature, and then determine the layer of the plurality of sample layers in which the element/molecule/feature is actually present. For example, the depth blur reducing algorithm may determine that the element/molecule/feature is located in the centermost layer of the plurality of layers or in the layer for which the image information and/or portions of the data/data stream attributable to the element/molecule/feature is best (i.e., clearest, strongest, highest percentage of the signal for the pixel, etc.). In this way, the depth blur reducing algorithm then removes portions of an image/data signal that are attributable to element/molecule/feature positioned outside the corresponding layer of the sample.

In various embodiments, the depth blur reducing algorithm may comprise a trained machine learning module (e.g., an artificial neural network (ANN), convolutional neural network (CNN), Fully Convolution Neural Network (FCN) etc.) that is able to identify portions of the images and/or the detector data/data signal that correspond to elements/molecules/features that are present in a layer of the sample 206 different from the layer to which the individual image/data signal corresponds. For example, the depth blur reducing algorithm may comprise a machine learning algorithm configured to process data in three or more dimensions, such as a 3D neural network. In some embodiments, the depth blur reducing algorithm may comprise a trained 3D neural network that has been trained to receive a plurality of images and/or data generated based on slice and view imaging of a sample where the electron penetration depth of the imaging beam is greater than the slice thickness, and to remove the portions of the plurality of images and/or data that are attributable to elements/molecules/features outside of the corresponding layer of the sample.

In some embodiments, the data enhancing module 256 may be executable by the processors 252 to first access a plurality of depth blur reducing algorithms 264, and then select a depth blur reducing algorithm from the plurality of depth blur reducing algorithms based on one or more microscope conditions (e.g., beam voltage, the spot size of the beam, the type of beam, etc.), sample conditions (e.g., a type of sample, a material of the sample, a feature of the sample, etc.), or a combination thereof. Each of the depth blur reducing algorithms of the plurality of depth blur reducing algorithms may be trained for different corresponding microscope conditions, sample conditions, or a combination thereof. In such embodiments, the data enhancing module 256 may select the depth blur reducing algorithm that was trained to the corresponding microscope conditions and/or sample conditions associated with the plurality of generated images.

The reconstruction generating module 260 can be executable by the processors 252 to generate a 3D reconstruction of the sample 206 based on the enhanced images and/or data that has been enhanced by the depth blur reducing algorithm(s) 266. Since the FIB column 212 is able to remove a layer of the sample 206 having a known thickness, the reconstruction generating module 260 is able to determine the location of the sample 206 to which each image of the series of images corresponds, and use this information to construct a 3D model/rendering of the sample 206.

The computing architecture 250 may include a training module 262 that is executable to train the depth blur reducing algorithm(s) 266 and/or a component machine learning algorithm(s) thereof to identify the key points in an image at salient features of the image. The training module 170 facilitates the training of the depth blur reducing algorithm(s) 266 and/or a component machine learning algorithm using a first set of training data acquired via slice and view charged particle imaging of a sample, where the electron interaction depth of the imaging beam is greater than the corresponding slice thickness, and a second set of training data that corresponds to labeled reconstruction of the sample. In some embodiments, the second set of training data is acquired using a low voltage slice and view process where the electron interaction depth of the imaging beam is less than the corresponding slice thickness. Alternatively, the second set of training data may be acquired at least in part by applying a deconvolution algorithm to at least a portion of the first set of training data. In another embodiment, the second set of training data is a simulated reconstruction of the sample based on a mapping of the sample, a description of the sample, known properties of the sample, or a combination thereof. The training module 262 may be configured to perform additional training with new training data, and then transmit updates the improve the performance of the depth blur reducing algorithm(s) 266 and/or the component machine learning algorithm(s) thereof.

The control module 264 can be executable by the processors 252 to cause a computing device 208 and/or example microscope system(s) 204 to take one or more actions. For example, the control module 264 may cause the example microscope system(s) 204 to perform a slice and view processing of the sample 206 where the electron interaction depth of the imaging beam is greater than the thickness of the layers removed by the delayering component (e.g.; the FIB column 212).

As discussed above, the computing devices 208 include one or more processors 252 configured to execute instructions, applications, or programs stored in a memory(s) 254 accessible to the one or more processors. In some examples, the one or more processors 252 may include hardware processors that include, without limitation, a hardware central processing unit (CPU), a graphics processing unit (GPU), and so on. While in many instances the techniques are described herein as being performed by the one or more processors 252, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories 254 accessible to the one or more processors 252 are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between memory 254 and other storage devices for purposes of memory management and data integrity. Alternatively, in other implementations, some or all the software components may execute in memory on another device and communicate with the computing devices 208. Some or all of the system components or data structures may also be stored (e.g., as instructions or structured data) on a non-transitory, computer accessible medium or a portable article to be read by an appropriate drive, various examples of which are described above. In some implementations, instructions stored on a computer-accessible medium separate from the computing devices 208 may be transmitted to the computing devices 208 via transmission media or signals such as electrical, electromagnetic, or digital signals, conveyed via a communication medium such as a wireless link. Various implementations may further include receiving, sending, or storing instructions and/or data implemented in accordance with the foregoing description upon a computer-accessible medium.

Figure 3:
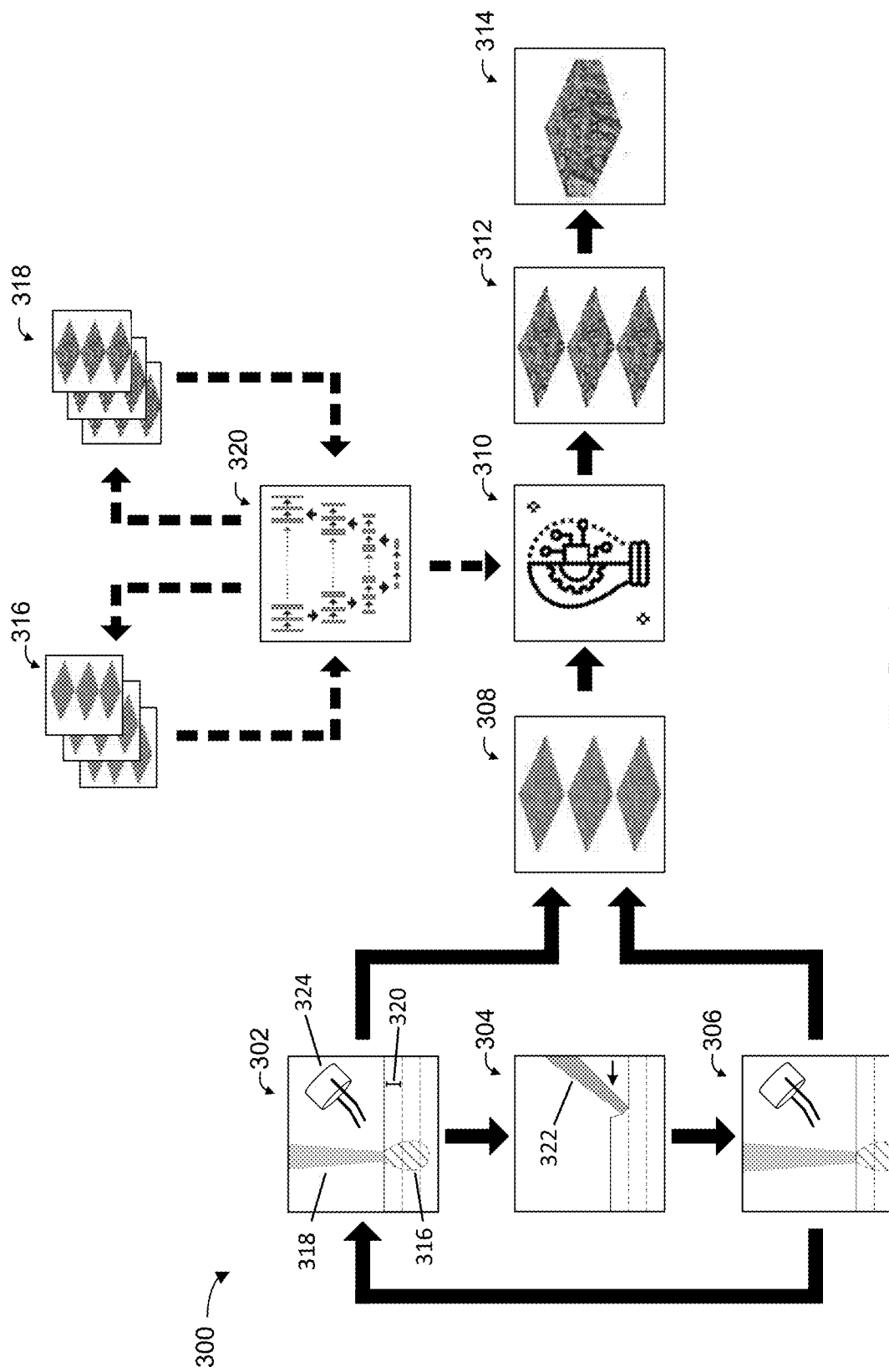
FIG. 3 shows a set of images that illustrate a process for generating high resolution reconstructions of 3D samples imaged using slice and view processes where the electron interaction depth of the imaging beam is greater than slice thicknesses, according to the present invention.

FIG. 3 depicts a visual flow diagram 300 that includes a plurality of images that together depict an example process that may be performed by the environment 200 to generate high resolution reconstructions of 3D samples imaged using slice and view processes where the electron interaction depth of the imaging beam is greater than slice thicknesses, according to the present invention. Images 302-306 show an example slice and view imaging process where the electron penetration depth 316 of the imaging beam 318 is greater that the thickness 320 of the layers removed by the delayering component 322. In image 304, the delayering component 322 is illustrated as a FIB, however the disclosure is not limited to this embodiment, and a person having skill in the art will understand that other known delayering technologies may be used within the scope of the disclosure. Emissions resulting from interactions between electrons of the imaging beam and the elements/molecules/features of the sample within the electron penetration depth are detected by a detector 324. As shown in FIG. 3, the process of imaging and delayering of the sample can be repeated until a desired portion of the sample has been imaged (e.g., a desired region, a number of layers, a desired depth of the sample, the entire sample, a percentage of the sample, one or more features of the sample, etc.).

Image 308 shows a plurality of images of layers of the sample generated based on data from the detector 324 obtained during the slice and view imaging process of images 302-306. Each of the images of the plurality of images is reconstructed using data from detector 324 during the imaging step of a corresponding layer. A depth blur reducing algorithm depicted symbolically in image 310 is applied to the plurality of generated images of image 308 and/or the data used to construct them so that information resultant from elements/molecules/features located outside of the corresponding layer of the sample is removed. In this way, the enhanced images shown in image 312 can be created. These enhanced images in 312 are enhanced versions of the slice and view images in 308 which have a reduced amount of information resultant from electron interaction outside the layer of the sample that the corresponding sample depicts.

Image 314 shows a 3D reconstruction of the sample based on the enhanced images and/or data. Accordingly, using methods of the present disclosure a higher resolution 3D reconstruction of the sample can be created that has reduced z-dimensional blurring due to electron interactions occurring outside individual slices of the slice and view processing.

Images 316-320 illustrate an optional process for training one or more neural network components of the depth blur reducing algorithm. In this process, training data (shown in image 316) obtained using a slice and view examination of a training sample is obtained with the imaging beam settings being such that its electron interaction depth is greater than the layer thickness. This training data, along with the labeled data shown in image 318 are input into a neural network training process, illustrated in image 320. The depth blur reducing algorithm may be periodically retrained, and/or a plurality of depth blur reducing algorithms may be trained such that each depth blur reducing algorithm is optimized for particular microscope and/or sample settings. People having skill in the art will understand that, while image 320 depicts a U-net training process, in various other embodiments other training processes can be used to train the depth blur reducing algorithm.

Figure 4:
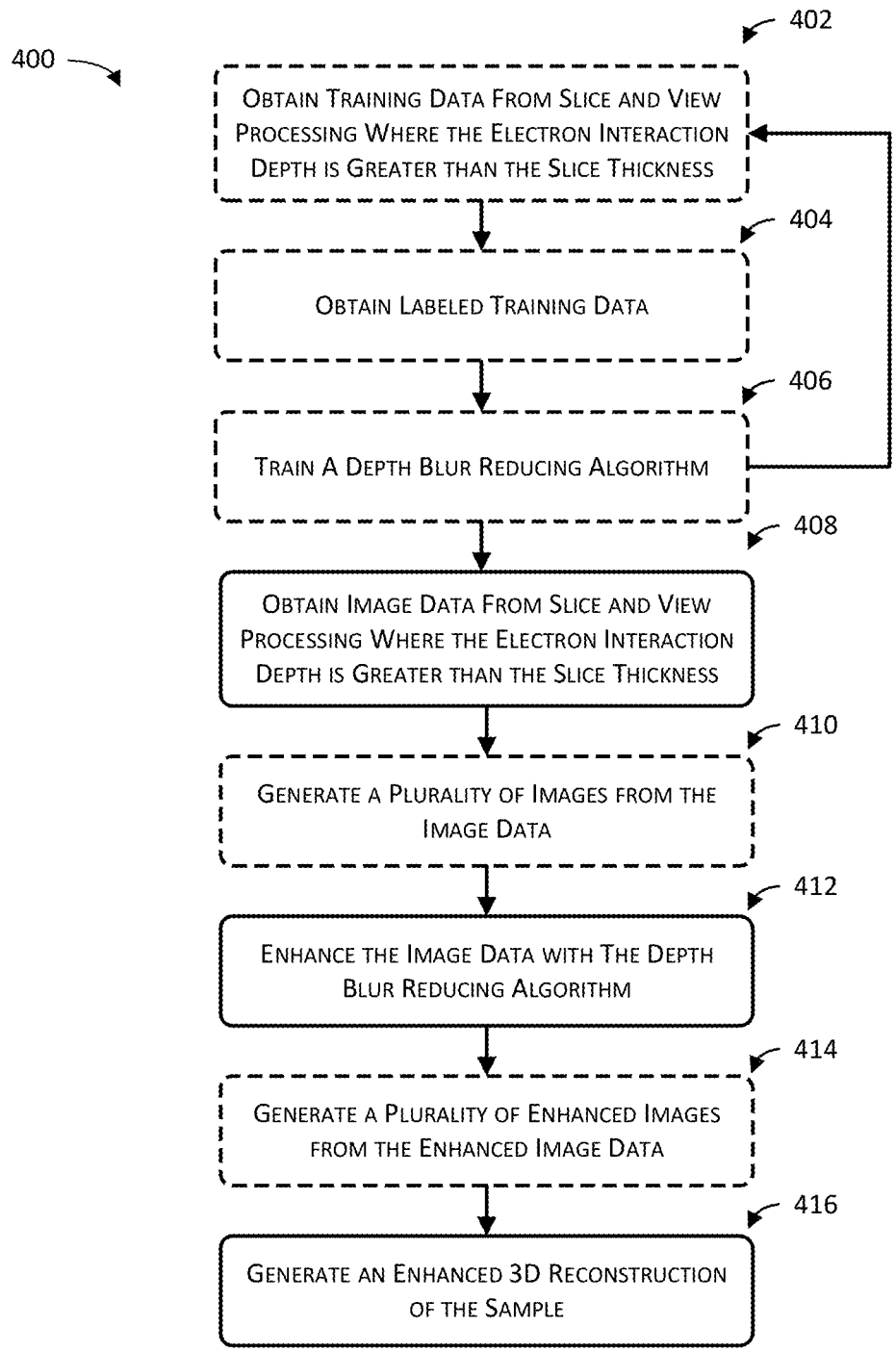
FIG. 4 shows a set of diagrams that illustrate a process for generating high resolution reconstructions of 3D samples imaged using slice and view processes where the electron interaction depth of the imaging beam is greater than slice thicknesses.

FIG. 4 is a flow diagram of illustrative processes depicted as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

Specifically, FIG. 4 is a flow diagram of an illustrative process 200 for generating high resolution reconstructions of 3D samples imaged using slice and view processes where the electron interaction depth of the imaging beam is greater than slice thicknesses. The process 400 may be implemented in environment 300 and/or by one or more computing device(s) 208, and/or by the computing architecture 250, and/or in other environments and computing devices.

At 402, training data is optionally obtained, where the training data was generated using a slice and view process on a sample where the electron depth of the imaging beam is greater than the slice thickness. The training data may be obtained via processing of the sample by a microscope system, such as the dual beam microscope system described in environment 200. Alternatively, the data may be obtained by a computing device by a wired or wireless connection (e.g., a WAN, a LAN, a cable hookup, etc.), or from another memory device storing the training data (e.g., another computer memory, a hard drive, a CD-ROM, a portable memory device, etc.)

At 404, labeled training data for the sample is optionally obtained. The labeled training data corresponds to slice and view images of the sample with reduced depth blur compared to the training data obtained in step 402. In some embodiments, the labeled training data is acquired using a low voltage slice and view process where the electron interaction depth of the imaging beam is less than the corresponding slice thickness. In another embodiment, the labeled training data may be acquired at least in part by applying a deconvolution algorithm, noise reduction algorithm, and/or another type of data cleaning algorithm to at least a portion of the training data obtained in step 402. Alternatively or in addition, at least a portion of the labeled training data may be a simulated reconstruction of the sample based on a mapping of the sample, a description of the sample, known properties of the sample, or a combination thereof.

At 406, a depth blur reducing algorithm is optionally trained based at least in part on the training data and the labeled data. For example, the depth blur reducing algorithm may comprise a neural network component (e.g., a 3D neural network) that is trained by inputting the training data and the labeled data into a 3D U-net. In some embodiments, the depth blur reducing algorithm may be periodically retrained to improve performance, or to adapt to particular microscope and/or sample settings. With repeated such trainings, the performance of the depth blur reducing algorithm may be improved. Alternatively, or in addition, a plurality of depth blur reducing algorithms may be trained such that each depth blur reducing algorithm is optimized for particular microscope and/or sample settings. In such embodiments, the training data in 402 is obtained with the desired microscope and/or sample settings that the resultant depth blur reducing algorithm is to be optimized for.

At 408, image data of a sample is obtained, where the image data was generated using a slice and view process where the electron depth of the imaging beam is greater than the slice thickness. In some embodiment the image data of the sample is obtained via processing of the sample by a microscope system, such as the dual beam microscope system described in environment 200. However, in other embodiments, obtaining the data may comprise obtaining the image data via a wired or wireless connection (e.g., a WAN, a LAN, a cable hookup, etc.), or from another memory device storing the training data (e.g., another computer memory, a hard drive, a CD-ROM, a portable memory device, etc.).

At 410, a plurality of images is optionally generated from the image data, with each image corresponding to a layer of the sample that was imaged using slice and view imaging. For example, the plurality of grayscale images that show contrasts indicative of the shape and/or the materials of individual layers of the sample to which each image corresponds. Because the image data of a sample was obtained using a slice and view process where the electron interaction depth is greater than the slice thickness, the data obtained during the imaging of each individual slice includes information relating to molecules/elements/features that are located outside the particular sample layer being imaged. Thus, each of the plurality of the images also includes information relating to molecules/elements/features that are not actually present in the depicted layer of the sample. This phenomenon causes a depth blurring of the images.

At 412, the image data is enhanced with the depth blur reducing algorithm. For example, the depth blur reducing algorithm may be applied to the image data and/or the plurality of images to remove information from individual images that correspond to elements/molecules/features that are not actually present in a layer of the sample to which the individual image/image data corresponds. In other words, the depth blur reducing algorithm reduces image information attributable to data/sensor data corresponding to emissions resultant from electron interactions outside the surface layer (i.e., the layer of the sample between the surface of the sample and the thickness the layer that is removed between imaging during slice and view imaging.) In this way, the depth reducing algorithm generates an enhanced version of the slice and view images that have a reduced amount of information resultant from electron interaction outside the layer of the sample that the corresponding sample depicts. In some embodiments, the depth reducing algorithm may selected from a plurality of depth blur reducing algorithms based on one or more microscope conditions (e.g., beam voltage, the spot size of the beam, the type of beam, etc.), sample conditions (e.g., a type of sample, a material of the sample, a feature of the sample, etc.), or a combination thereof. Each of the depth blur reducing algorithms of the plurality of depth blur reducing algorithms may be trained for different corresponding microscope conditions, sample conditions, or a combination thereof.

At 414, a plurality of enhanced images is optionally generated from the enhanced image data. Because the enhanced image data associated with each image has a reduced amount of information relating to molecules/elements/features that are not present in the sample layer the image depicts, the images will have a higher resolution, clarity, and/or reduced blurring.

At 416, an enhanced 3D reconstruction of the sample is generated based on the enhanced image data and/or the enhanced images. Because the enhanced image data associated with each image has a reduced about of information relating to molecules/elements/features that are not present in the sample layer the image depicts, the 3D reconstruction will have a reduced amount of the depth blurring that is a problem in prior art slice and view imaging process.

Figure 5:
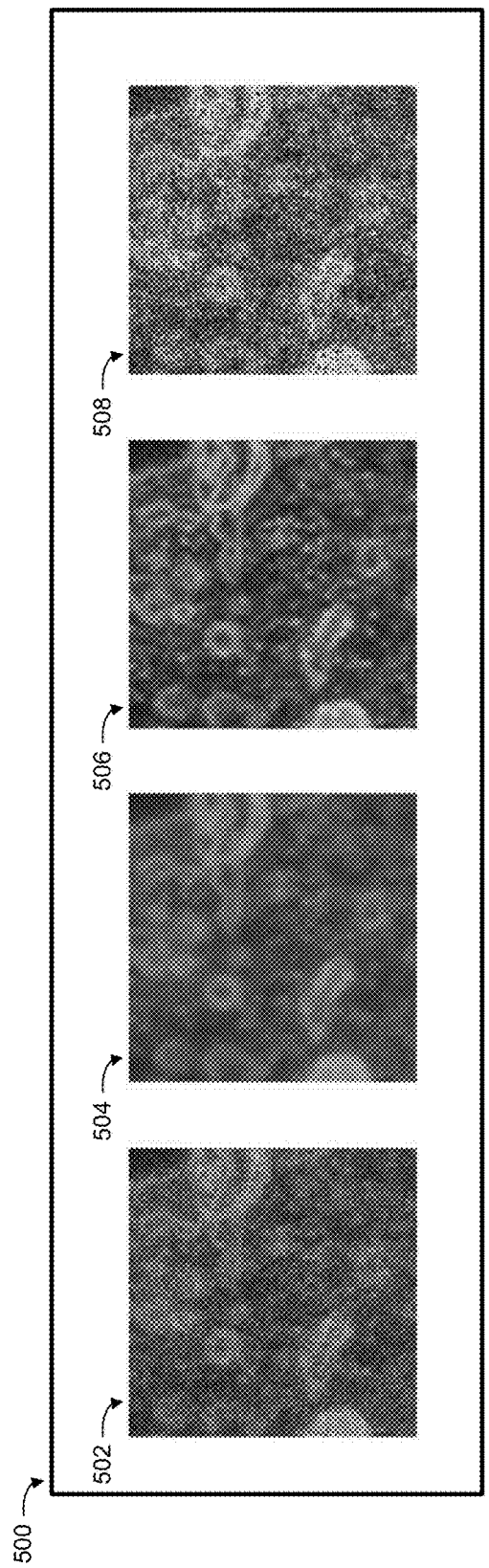
FIGS. 5 and 6 are experimental results that show slice and view images processed with the inventive process compared to slice and view images by prior art systems.
Figure 6:
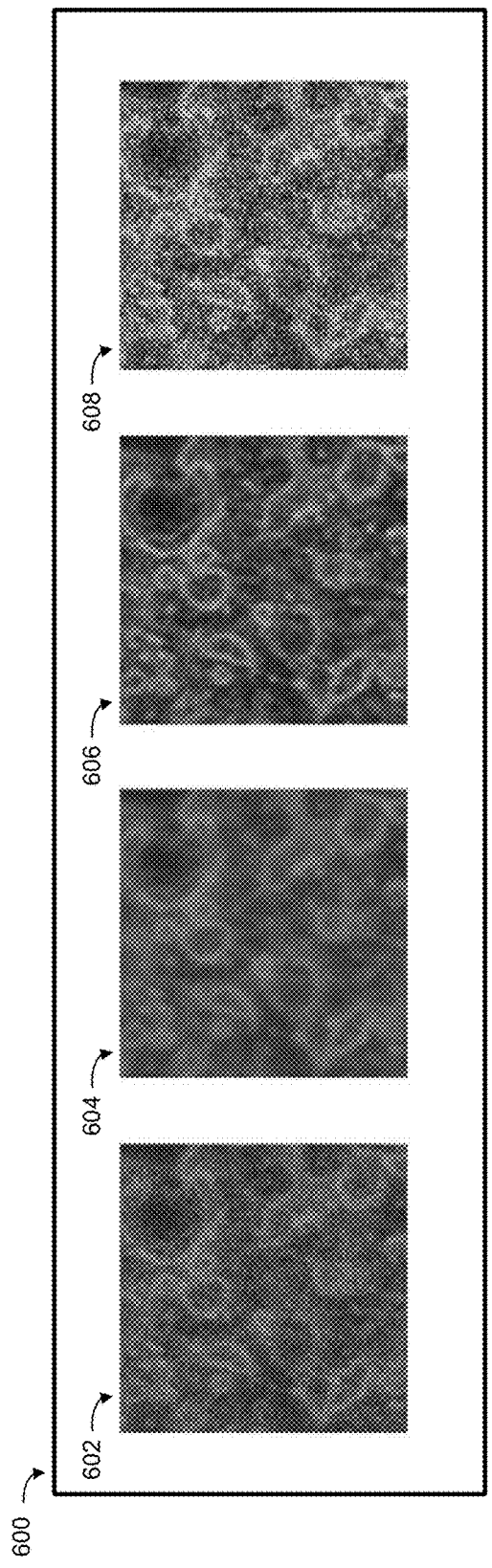

FIGS. 5 and 6 show slice and view images processed with the inventive process compared to slice and view images by prior art systems. For example, images 502 and 602 show an image of a layer of a sample obtained via slice and view processing where the electron penetration depth of the imaging beam is greater than the slice thickness. Images 504 and 604 show the results of applying image enhancement filters to the original data of images 502 and 602, respectively. Images 506 and 606 show the results of applying a depth reducing algorithm of the present disclosure to the original data of images 502 and 602, respectively. Images 508 and 608 are the results of applying a deconvolution algorithm to post process the original data of images 502 and 602, respectively. As can be seen, the methods and systems of the present disclosure cause an improvement in the resolution of the sample compared to the prior art systems, while also increasing the signal to noise ratio of the images.

Examples of inventive subject matter according to the present disclosure are described in the following enumerated paragraphs.

A1. A method for improved resolution reconstructions via slice and view charged particle imaging, the method comprising: acquiring first data relating to a first layer of a sample, the first data having been acquired by a first irradiation of the first layer of the sample with a charged particle beam; acquiring second data relating to a second layer of a sample, the second data having been acquired by a second irradiation of the second layer of the sample with the charged particle beam, wherein: the first layer of the sample is removed between the first irradiation and the second irradiation; and an electron interaction depth of the charged particle beam is larger than both the thickness of the first layer and the thickness of the second layer; enhancing the first data with a depth blur reducing algorithm to create enhanced first data, wherein the depth blur reducing algorithm reduces depth blur caused by first portions of the first data resultant from electron interaction outside the first layer; enhancing the second data with the depth blur reducing algorithm to create enhanced second data, wherein the depth blur reducing algorithm reduces depth blur caused by second portions of the second data resultant from electron interaction outside the second layer; and constructing a high resolution 3D reconstruction of the sample using the enhanced first data and the enhanced second data.

A2. The method of claim 1, further comprising the steps of: generating a first image of the first layer of the sample; and generating a second image of the second layer of the sample.

A3. The method of any of claims A1-A2, wherein enhancing the first data comprises generating an enhanced first image that has a reduced amount of information based on electron interaction outside the first layer.

A3.1. The method of paragraph A3, wherein enhancing the second data comprises generating an enhanced second image that has a reduced amount of information based on electron interaction outside the second layer.

A4. The method of any of paragraphs A1-A3.1, wherein reducing the depth blur corresponds to: removing the first portions of the first data resultant from electron interaction outside the first layer from the first data; and removing the second portion of the second data resultant from electron interaction outside the second layer from the second data.

A5. The method of any of paragraphs A1-A4, wherein the depth blur corresponds to the presence of image data resulting from the electron interaction depth of the charged particle beam being greater than the thickness of the first layer and/or the second layer.

A6. The method of any of paragraphs A1-A5, wherein the charged particle beam is an electron beam.

A6.1. The method of paragraph A6, wherein the electron beam is a single energy electron beam.

A7. The method of any of paragraphs A1-A6.1, wherein the first layer of the sample is removed with one or more of: a focused ion beam; a laser; an electron beam; and a diamond blade.

A8. The method of any of paragraphs A1-A7, wherein the depth blur reducing algorithm is a neural network.

A8.1. The method of paragraph A8, wherein the depth blur reducing algorithm is a 3D neural network.

A8.2. The method of any of paragraphs A8-A8.2, wherein the neural network is trained using: a first set of training data acquired via slice and view charged particle imaging of a sample, where the electron interaction depth of the imaging beam is greater than the corresponding slice thickness; and a second set of training data that corresponds to labeled reconstruction of the sample.

A8.2.1. The method of paragraphs A8.2, wherein the second set of training data is acquired using a low voltage slice and view charged particle imaging processing, where the electron interaction depth of the imaging beam is less than the corresponding slice thickness.

A8.2.2. The method of any of paragraphs A8.2-A8.2.1, wherein the second set of training data is acquired at least in part by applying a deconvolution algorithm to the first set of data.

A8.2.3. The method of any of paragraphs A8.2-A8.2.2, wherein the second set of training data is acquired simulated based on a mapping of the sample, a description of the sample, known properties of the sample, or a combination thereof.

A8.3. The method of any of paragraphs A8-A8.2.3, wherein the method further comprises training the neural network with a first set of training data acquired via slice and view charged particle imaging of a sample, where the electron interaction depth of the imaging beam is greater than the corresponding slice thickness, and a second set of training data that corresponds to labeled reconstruction of the sample.

A.8.4. The method of any of paragraphs A8-A8.3, wherein the depth blur reducing algorithm is a training based 3D blind deconvolution algorithm A.8.5. The method of any of paragraphs A8-A8.4, wherein the depth blur reducing algorithm is a 3D blind neural network based algorithm.

A9. The method of any of paragraphs A1-A8.5, wherein the method further comprises accessing a plurality of depth blur reducing algorithms, and selecting the depth blur reducing algorithm from the plurality of depth blur reducing algorithms based on one or more microscope conditions.

A9.1. The method of paragraphs A9, wherein the microscope conditions include the charged particle beam voltage, the spot size of the charged particle beam, the type of charged particle beam.

A9.2. The method of any of paragraphs A9-A9.1, wherein individual depth blur reducing algorithms of the plurality of depth blur reducing algorithms are trained for different corresponding microscope conditions.

A10. The method of any of paragraphs A1-A9.2, wherein the method further comprises accessing a plurality of depth blur reducing algorithms, and selecting the depth blur reducing algorithm from the plurality of depth blur reducing algorithms based on one or more sample conditions.

A10.1. The method of paragraph A10, wherein the one or more sample conditions include a type of sample, a material of the sample, a feature of the sample, or a combination thereof.

A10.2. The method of any of paragraphs A10-A10.1, wherein individual depth blur reducing algorithms of the plurality of depth blur reducing algorithms are trained for different corresponding sample conditions.

B1. A charged particle microscope system, the system comprising: a sample holder configured to hold a sample; an electron beam source configured to emit an electron beam toward the sample; an electron beam column configured to direct the electron beam onto the sample; a delayering component configured to remove a layer from the surface of the sample, the layer having a known thickness; one or more detectors configured to detect emissions resultant from the electron beam irradiating the sample; one or more processors; and a memory storing instructions that when executed on the one or more processors causes the charged particle microscope system to perform the method of any of paragraphs A1-A10.2.

C1. A method for improved resolution reconstructions via slice and view charged particle imaging, the method comprising: training a depth blur reducing algorithm based at least in part on: a first set of training data acquired via slice and view charged particle imaging of a training sample, where an electron interaction depth of an imaging beam is greater than the corresponding slice thickness; and a second set of training data that corresponds to a labeled reconstruction of the training sample; acquiring first data relating to a first layer of a sample, the first data having been acquired by a first irradiation of the first layer of the sample with a charged particle beam; acquiring second data relating to a second layer of a sample, the second data having been acquired by a second irradiation of the second layer of the sample with the charged particle beam, wherein: the first layer of the sample is removed between the first irradiation and the second irradiation; and an electron interaction depth of the charged particle beam is larger than both the thickness of the first layer and the thickness of the second layer; enhancing the first data with the depth blur reducing algorithm to create enhanced first data, wherein the depth blur reducing algorithm reduces depth blur caused by first portions of the first data resultant from electron interaction outside the first layer; enhancing the second data with the depth blur reducing algorithm to create enhanced second data, wherein the depth blur reducing algorithm reduces depth blur caused by second portions of the second data resultant from electron interaction outside the second layer; and constructing a high resolution 3D reconstruction of the sample using the enhanced first data and the enhanced second data.

C2. The method of paragraph C1, further comprising the steps of: generating a first image of the first layer of the sample; and generating a second image of the second layer of the sample.

C2.1. The method of paragraph C2, wherein enhancing the first data corresponds to generating an enhanced first image that has a reduced amount of information based on electron interactions outside the first layer.

C2.2. The method of any of paragraphs C2-C2.1, wherein enhancing the second data corresponds to generating an enhanced second image that has a reduced amount of information based on electron interaction outside the second layer.

C3. The method of any of paragraphs C1-C2.2, wherein reducing the depth blur corresponds to: removing the first portions of the first data resultant from electron interaction outside the first layer from the first data; and removing the second portion of the second data resultant from electron interaction outside the second layer from the second data.

C4. The method of any of paragraphs C1-C3, wherein the depth blur corresponds to the presence of image data resulting from the electron interaction depth of the charged particle beam being greater than the thickness of the first layer and/or the second layer.

C5. The method of any of paragraphs C1-4, wherein the charged particle beam is an electron beam.

C5.1. The method of claim C5, wherein the electron beam is a single energy electron beam.

C6. The method of any of paragraphs C1-C5.1, wherein the first layer of the sample is removed with one or more of: a focused ion beam; a laser; an electron beam; and a diamond blade.

C7. The method of any of paragraphs C1-C6, wherein the depth blur reducing algorithm is a neural network.

C7.1. The method of claim C7, wherein the depth blur reducing algorithm is a 3D neural network.

C8. The method of any of paragraphs C1-C7.1, wherein the second set of training data is acquired using a low voltage slice and view charged particle imaging processing, where the electron interaction depth of the imaging beam is less than the corresponding slice thickness.

C9. The method of any of paragraphs C1-C8, wherein the second set of training data is acquired at least in part by applying a deconvolution algorithm to the first set of data.

C10. The method of any of paragraphs C1-C9, wherein the second set of training data is acquired simulated based on a mapping of the sample, a description of the sample, known properties of the sample, or a combination thereof.

C11. The method of any of paragraphs C1-C10, wherein the method further comprises accessing a plurality of depth blur reducing algorithms, and selecting the depth blur reducing algorithm from the plurality of depth blur reducing algorithms based on one or more microscope conditions.

C11.1. The method of claim C11, wherein the microscope conditions include the charged particle beam voltage, the spot size of the charged particle beam, the type of charged particle beam.

C11.2. The method of claim C11, wherein individual depth blur reducing algorithms of the plurality of depth blur reducing algorithms are trained for different corresponding microscope conditions.

C12. The method of any of paragraphs C1-C11.2, wherein the method further comprises accessing a plurality of depth blur reducing algorithms, and selecting the depth blur reducing algorithm from the plurality of depth blur reducing algorithms based on one or more sample conditions.

C12.1. The method of claim C12, wherein the one or more sample conditions include a type of sample, a material of the sample, a feature of the sample, or a combination thereof.

C12.1. The method of claim C12, wherein individual depth blur reducing algorithms of the plurality of depth blur reducing algorithms are trained for different corresponding sample conditions.

D1. Use of the system of B1 to perform a method of any of paragraphs A1-A10.2 or C1-C12.1.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "determine," "identify," "produce," and "provide" to describe the disclosed methods. These terms are high-level abstractions of the actual operations that are performed. The actual operations that correspond to these terms will vary depending on the particular implementation and are readily discernible by one of ordinary skill in the art.

What is claimed is:

1. A method for generating improved 3D reconstructions of a sample via slice and view charged particle imaging, the method comprising:
   acquiring first data relating to a first layer of a sample, the first data having been acquired by a first irradiation of the first layer of the sample with a charged particle beam;
   acquiring second data relating to a second layer of a sample, the second data having been acquired by a second irradiation of the second layer of the sample with the charged particle beam, wherein:
   the first layer of the sample is removed between the first irradiation and the second irradiation; and
   an electron interaction depth of the charged particle beam is larger than the thickness of the first layer and the thickness of the second layer;
   enhancing the first data with a training based 3D blind deconvolution algorithm to create enhanced first data, wherein the training based 3D blind deconvolution algorithm reduces depth blur caused by first portions of the first data resultant from electron interaction outside the first layer;
   enhancing the second data with the training based 3D blind deconvolution algorithm to create enhanced second data, wherein the training based 3D blind deconvolution algorithm reduces depth blur caused by second portions of the second data resultant from electron interaction outside the second layer; and
   constructing a high-resolution 3D reconstruction of the sample using the enhanced first data and the enhanced second data.

2. The method of claim 1, further comprising the steps of:
   generating a first image of the first layer of the sample; and
   generating a second image of the second layer of the sample.

3. The method of claim 1, wherein enhancing the first data comprises generating an enhanced first image that has a reduced amount of information based on electron interaction outside the first layer, and enhancing the second data comprises generating an enhanced second image that has a reduced amount of information based on electron interaction outside the second layer.

4. The method of claim 1, wherein reducing the depth blur corresponds to:
   removing the first portions of the first data resultant from electron interaction outside the first layer from the first data; and
   removing the second portion of the second data resultant from electron interaction outside the second layer from the second data.

5. The method of claim 1, wherein the depth blur corresponds to the presence of image data resulting from the electron interactions occurring outside of a sample layer to which the image corresponds.

6. The method of claim 1, wherein the charged particle beam is a single energy electron beam.

7. The method of claim 1, wherein the first layer of the sample is removed with one or more of:
   a focused ion beam;
   a laser;
   an electron beam; and
   a diamond blade.

8. The method of claim 1, wherein the training based 3D blind deconvolution algorithm comprises a 3D neural network.

9. The method of claim 8, wherein the 3D neural network is trained using:
   a first set of training data acquired via slice and view charged particle imaging of a training sample, where the electron interaction depth of the imaging beam is greater than the corresponding slice thickness; and
   a second set of training data that corresponds to labeled reconstruction of the training sample.

10. The method of claim 9, wherein the second set of training data is acquired using a low voltage slice and view charged particle imaging processing of the training sample, where the electron interaction depth of the imaging beam is less than the corresponding slice thickness.

11. The method of claim 9, wherein the second set of training data is acquired at least in part by applying a deconvolution algorithm to the first set of training data.

12. The method of claim 9, wherein the second set of training data is acquired simulated based on a mapping of the training sample, a description of the training sample, known properties of the training sample, or a combination thereof.

13. The method of claim 1, wherein the method further comprises accessing a plurality of training based 3D blind deconvolution algorithm, and selecting the depth blur reducing algorithm from the plurality of training based 3D blind deconvolution algorithms based on one or more microscope conditions, wherein individual training based 3D blind deconvolution algorithms of the plurality of training based 3D blind deconvolution algorithms are trained for different corresponding microscope conditions.

14. The method of claim 1, wherein the method further comprises accessing a plurality of training based 3D blind deconvolution algorithms, and selecting the training based 3D blind deconvolution algorithm from the plurality of training based 3D blind deconvolution algorithms based on one or more sample conditions, wherein individual training based 3D blind deconvolution algorithms of the plurality of training based 3D blind deconvolution algorithms are trained for different corresponding sample conditions.

15. A charged particle microscope system, the system comprising:
- a sample holder configured to hold a sample;
- an electron beam source configured to emit an electron beam toward the sample;
- an electron beam column configured to direct the electron beam onto the sample;
- a delayering component configured to remove a layer from the surface of the sample, the layer having a known thickness;
- one or more detectors configured to detect emissions resultant from the electron beam irradiating the sample;
- one or more processors; and
- a memory storing instructions that when executed on the one or more processors causes the charged particle microscope system to:
- acquire first data relating to a first layer of the sample, the first data having been acquired by a first irradiation of the first layer of the sample with the electron beam;
- acquire second data relating to a second layer of a sample, the second data having been acquired by a second irradiation of the second layer of the sample with the electron beam, wherein:
- the first layer of the sample is removed by the delayering component between the first irradiation and the second irradiation; and
- an electron interaction depth of the electron beam is larger than the thickness of the first layer and the thickness of the second layer;
- enhance the first data with a training based 3D blind deconvolution algorithm to create enhanced first data, wherein the training based 3D blind deconvolution algorithm reduces depth blur caused by first portions of the first data resultant from electron interaction outside the first layer;
- enhance the second data with the training based 3D blind deconvolution algorithm to create enhanced second data, wherein the training based 3D blind deconvolution algorithm reduces depth blur caused by second portions of the second data resultant from electron interaction outside the second layer; and
- construct a high resolution 3D reconstruction of the sample using the enhanced first data and the enhanced second data.

16. The system of claim 15, wherein reducing the depth blur corresponds to:
- removing the first portions of the first data resultant from electron interaction outside the first layer from the first data; and
- removing the second portion of the second data resultant from electron interaction outside the second layer from the second data.

17. The system of claim 15, wherein the training based 3D blind deconvolution algorithm comprises a 3D neural network.

18. The system of claim 17, wherein the 3D neural network is trained using:
- a first set of training data acquired via slice and view charged particle imaging of a training sample, where the electron interaction depth of the imaging beam is greater than the corresponding slice thickness; and
- a second set of training data that corresponds to labeled reconstruction of the training sample.

19. The system of claim 18, wherein the second set of training data is acquired using a low voltage slice and view charged particle imaging processing of the training sample, where the electron interaction depth of the imaging beam is less than the corresponding slice thickness.

20. The system of claim 18, wherein the second set of training data is acquired at least in part by applying a deconvolution algorithm to the first set of training data.

* * * * *